(12) United States Patent
Yoshino

(10) Patent No.: US 8,408,859 B2
(45) Date of Patent: Apr. 2, 2013

(54) WAFER TRANSFER DEVICE AND WAFER TRANSFER METHOD

(75) Inventor: Katsuhiro Yoshino, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 838 days.

(21) Appl. No.: 12/356,672

(22) Filed: Jan. 21, 2009

(65) Prior Publication Data

US 2009/0202324 A1    Aug. 13, 2009

(30) Foreign Application Priority Data

Feb. 8, 2008   (JP) .................................. 2008-028753

(51) Int. Cl.
*B65H 1/00* (2006.01)
(52) U.S. Cl. .............. 414/223.01; 414/411; 414/416.04; 414/416.09; 414/421
(58) Field of Classification Search ............ 414/223.01, 414/411, 937, 938, 416.04, 416.09, 421
See application file for complete search history.

(56) References Cited

U.S. PATENT DOCUMENTS

| 5,151,008 A * | 9/1992 | Ishida et al. ............... 414/744.5 |
| 5,255,792 A * | 10/1993 | Harper et al. ................. 209/605 |

FOREIGN PATENT DOCUMENTS

| JP | 2003-318247 | 7/2003 |
| JP | 2008-028753 | 2/2008 |

* cited by examiner

*Primary Examiner* — Saul Rodriguez
*Assistant Examiner* — Willie Berry, Jr.
(74) *Attorney, Agent, or Firm* — Taft Stettinius & Hollister LLP

(57) ABSTRACT

A wafer transfer device and method capable of preventing a wafer from falling off of a carrier. A first carrier receiver holding a first carrier has a box-like shape having an opening through which the first carrier is attached/removed to/from the first carrier receiving member. A second carrier receiver holding a second carrier has a box-like shape having an opening through which the second carrier is attached/removed to/from the first carrier receiving member. The first carrier and the second carrier can be attached/removed to/from the first carrier receiver and the second carrier receiver, respectively. Owing to such a configuration, it is possible to prevent a wafer received in the first carrier and the second carrier from falling off from the first carrier and the second carrier, respectively.

8 Claims, 13 Drawing Sheets

WAFER TRANSFER DEVICE AND WAFER TRANSFER METHOD

CROSS-REFERENCE TO RELATED APPLICATIONS

This application claims priority under 35 U.S.C. §119 to Japanese Patent Application Serial No. JP 2008-028753 filed on Feb. 8, 2008, entitled "WAFER TRANSFER DEVICE AND WAFER TRANSFER METHOD," the disclosure of which is hereby incorporated by reference.

RELATED ART

1. Field of the Invention

The present disclosure relates to a wafer transfer device used for transferring a wafer received in a carrier to another carrier, and a wafer transfer method using the same.

2. Description of the Related Art

Semiconductor wafers are sliced to a predetermined thickness from a single crystalline silicon ingot in a wafer manufacturing plant or the like and subjected to predetermined processing such as beveling or wrapping, and are thereafter delivered to a semiconductor facility in a transport carrier. When the semiconductor wafers are delivered to the semiconductor facility, the wafers are transferred to carriers which are suitable for each process (for example, a cleaning process).

INTRODUCTION TO THE INVENTION

In accordance with a first exemplary aspect of the disclosure, there is provided a wafer transfer device comprising: a first carrier receiver configured to removably holding a first carrier having a first entrance opening allowing entering/exiting of a wafer thereto/therefrom; a second carrier receiver disposed at a position adjacent to the first carrier receiver and configured to removably hold a second carrier having a second entrance opening through which the wafer is transferred through the first entrance opening of the first carrier; a mover for moving the first carrier receiver to a first entrance position wherein the first carrier can be attached/removed to/from the first carrier receiver in a state where the first entrance opening is oriented in the upper direction and to a first reception position wherein the wafer can be transferred between the first carrier and the second carrier, the mover being configured to move the second carrier receiver to a second entrance position wherein the second carrier can be attached/removed to/from the second carrier receiver in a state where the second entrance opening is oriented in the upper direction and to a second reception position wherein the first entrance opening of the first carrier moved to the first reception position is opposed to the second entrance opening of the second carrier; and a wafer transfer device for transferring the wafer between the first carrier and the second carrier in a state where the first entrance opening of the first carrier of the first carrier receiver moved to the first reception position is opposed to the second entrance opening of the second carrier of the second carrier receiver moved to the second reception position.

According to the configuration of the first aspect, the first carrier receiver is configured to removably hold the first carrier having the first entrance opening allowing entering/exiting of the wafer thereto/therefrom. Moreover, the second carrier receiver is disposed at a position adjacent to the first carrier receiver and configured to removably hold the second carrier having the second entrance opening through which the wafer is transferred through the first entrance opening of the first carrier.

Moreover, the mover is configured to move the first carrier receiver to the first entrance position wherein the first carrier can be attached/removed to/from the first carrier receiver in a state where the first entrance opening is oriented in the upper direction and to the first reception position wherein the wafer can be transferred between the first carrier and the second carrier.

The mover is also configured to move the second carrier receiver to the second entrance position wherein the second carrier can be attached/removed to/from the second carrier receiver in a state where the second entrance opening is oriented in the upper direction and to the second reception position wherein the first entrance opening of the first carrier moved to the first reception position is opposed to the second entrance opening of the second carrier.

Furthermore, the wafer transfer device is configured to transfer the wafer between the first carrier and the second carrier in a state where the first entrance opening of the first carrier of the first carrier receiver moved to the first reception position is opposed to the second entrance opening of the second carrier of the second carrier receiver moved to the second reception position.

In this way, the first carrier and the second carrier can be attached/removed to/from the first carrier receiver and the second carrier receiving member, respectively, in a state where the first entrance opening of the first carrier and the second entrance opening of the second carrier are oriented in the upper direction. Owing to such a configuration, it is possible to prevent the wafer received in the first carrier and the second carrier from falling off from the first carrier and the second carrier, respectively.

A wafer transfer device according to a second aspect of the disclosure is the wafer transfer device according to the first aspect, in which the mover comprises: a first rotating shaft member configured to rotate the first carrier receiver between the first entrance position and the first reception position; an intermediate rotating shaft member configured to rotatably connecting the first carrier receiver and the second carrier receiver with each other; a second rotating shaft member configured to rotate the second carrier receiver between the second entrance position and the second reception position; and a rotation support member configured to movably support the second rotating shaft member toward and away from the first carrier receiving member, and in which the wafer transfer device is configured by a tilting table configured to cause the first carrier receiver and the second carrier receiver to be tilted in a state where the first entrance opening of the first carrier is opposed to the second entrance opening of the second carrier.

According to the configuration of the second aspect, the first carrier receiver disposed at the first entrance position is rotated about the first rotating shaft member to be moved to the first reception position. Moreover, when the first carrier receiver is rotated, the intermediate rotating shaft member is also rotated about the first rotating shaft member.

Moreover, with the movement of the intermediate rotating shaft member, the second carrier receiver disposed at the second entrance position is also rotated about the second rotating shaft member to be moved to the second reception position by the second rotating shaft member moving while being supported by the rotation support member.

Moreover, the tilting table is configured to cause the first carrier receiver and the second carrier receiver to be tilted in a state where the first entrance opening of the first carrier is opposed to the second entrance opening of the second carrier.

Owing to such a configuration, the received wafer rolls over to be transferred to the carrier. In this way, the wafer can be easily transferred using technique different from the conventional technique.

In accordance with a third aspect of the disclosure, there is provided a wafer transfer method using a wafer transfer device which comprises: a first carrier receiver configured to removably holding a first carrier having a first entrance opening allowing entering/exiting of a wafer thereto/therefrom; a second carrier receiver disposed at a position adjacent to the first carrier receiver and configured to removably hold a second carrier having a second entrance opening through which the wafer is transferred through the first entrance opening of the first carrier; a mover for moving the first carrier receiver to a first entrance position wherein the first carrier can be attached/removed to/from the first carrier receiver in a state where the first entrance opening is oriented in the upper direction and to a first reception position wherein the wafer can be transferred between the first carrier and the second carrier, the mover being configured to move the second carrier receiver to a second entrance position wherein the second carrier can be attached/removed to/from the second carrier receiver in a state where the second entrance opening is oriented in the upper direction and to a second reception position wherein the first entrance opening of the first carrier moved to the first reception position is opposed to the second entrance opening of the second carrier; and a wafer transfer device for transferring the wafer between the first carrier and the second carrier in a state where the first entrance opening of the first carrier of the first carrier receiver moved to the first reception position is opposed to the second entrance opening of the second carrier of the second carrier receiver moved to the second reception position, the wafer transfer method transferring the wafer between the first carrier and the second carrier, comprising the steps of: attaching the first carrier and the second carrier to the first carrier receiver and the second carrier receiver disposed at the first entrance position and the second entrance position, respectively; moving, by means of the mover, the first carrier receiver from the first entrance position to the first reception position, while moving the second carrier receiver from the second entrance position to the second reception position; transferring, by means of the wafer transfer device, the wafer between the first carrier and the second carrier in a state where the first entrance opening of the first carrier of the first carrier receiver moved to the first reception position is opposed to the second entrance opening of the second carrier of the second carrier receiver moved to the second reception position; upon completion of the transferring of the wafer, moving, by means of the mover, the first carrier receiver from the first reception position to the first entrance position, while moving the second carrier receiver from the second reception position to the second entrance position; and removing the first carrier and the second carrier from the first carrier receiver and the second carrier receiver disposed at the first entrance position and the second entrance position, respectively.

According to the configuration of the third aspect, the first carrier and the second carrier are first attached to the first carrier receiver and the second carrier receiver disposed at the first entrance position and the second entrance position, respectively. That is, the first carrier and the second carrier are attached to the first carrier receiver and the second carrier receiving member, respectively, in a state where the first entrance opening of the first carrier and the second entrance opening of the second carrier are oriented in the upper direction.

Next, by the mover, the first carrier receiver is moved from the first entrance position to the first reception position, while the second carrier receiver is moved from the second entrance position to the second reception position.

Next, by the wafer transfer device, the wafer is caused to roll over to be transferred between the first carrier and the second carrier in a state where the first entrance opening of the first carrier of the first carrier receiver moved to the first reception position is opposed to the second entrance opening of the second carrier of the second carrier receiver moved to the second reception position.

Upon completion of the transferring of the wafer, by the mover, the first carrier receiver is moved from the first reception position to the first entrance position, while the second carrier receiver is moved from the second reception position to the second entrance position.

Finally, the first carrier and the second carrier are removed from the first carrier receiver and the second carrier receiver disposed at the first entrance position and the second entrance position, respectively. That is, the first carrier and the second carrier are removed from the first carrier receiver and the second carrier receiving member, respectively, in a state where the first entrance opening of the first carrier and the second entrance opening of the second carrier are oriented in the upper direction.

In this way, the first carrier and the second carrier can be attached/removed to/from the first carrier receiver and the second carrier receiving member, respectively, in a state where the first entrance opening of the first carrier and the second entrance opening of the second carrier are oriented in the upper direction. Owing to such a configuration, it is possible to prevent the wafer received in the first carrier and the second carrier from falling off from the first carrier and the second carrier, respectively.

In accordance with the various aspect of the present invention, it is possible to prevent the wafer received in the carrier from falling off from the carrier.

In an aspect, a wafer transfer device may include a first rotatable semiconductor wafer carrier receiver removably mounted to a first wafer carrier having an opening allowing entry of a wafer into the first wafer carrier and allowing egress of the wafer from the first wafer carrier; a second rotatable semiconductor wafer carrier receiver disposed at a position adjacent to the first semiconductor wafer carrier receiver and removably mounted to a second semiconductor wafer carrier having an opening through which the wafer is transferred through the opening of the first semiconductor wafer carrier; an actuator operatively coupled to at least one of the first semiconductor wafer carrier receiver and the second semiconductor wafer carrier receiver, the actuator operative to concurrently rotate at least one of the first semiconductor wafer carrier receiver and the second semiconductor wafer carrier receiver so that both openings of the first and second semiconductor wafer carrier receivers are rotated and face one another.

In a detailed embodiment, the wafer transfer device may include a moving mechanism coupled to the actuator, the moving mechanism including a first rotating shaft configured to rotate the first semiconductor wafer carrier receiver between a first wafer entrance position and a first wafer reception position; an intermediate rotating shaft configured to rotatably connect the first semiconductor wafer carrier receiver and the second semiconductor wafer carrier receiver with each other; and a second rotating shaft configured to rotate the second semiconductor wafer carrier receiver between a second wafer entrance position and a second wafer reception position.

In a further detailed embodiment, the wafer transfer device may include a tilting table operative to tilt at least one of the first semiconductor wafer carrier receiver and the second semiconductor wafer carrier receiver in a state where the opening of the first semiconductor wafer carrier is opposed to the opening of the second semiconductor wafer carrier.

In another detailed embodiment, the wafer transfer device may include a first stationary frame mounted to the first semiconductor wafer carrier receiver and about which the first semiconductor wafer carrier receiver rotates; and a second stationary frame mounted to the second semiconductor wafer carrier receiver and about which the second semiconductor wafer carrier receiver rotates.

In a further detailed embodiment, the second semiconductor wafer carrier receiver may be laterally and rotationally repositionable with respect to the second stationary frame. In another further detailed embodiment, the wafer transfer device may include an axel selectively engaging at least one of the first semiconductor wafer carrier receiver and the second semiconductor wafer carrier receiver, where the first semiconductor wafer carrier receiver includes a first bearing; the second semiconductor wafer carrier receiver includes a second bearing; the first bearing and second bearing are adapted to receive the axel and be coaxial with respect to one another so that the first semiconductor wafer carrier receiver and the second semiconductor wafer carrier receiver are rotatable about the axel.

In another aspect, a wafer transfer device may include a first carrier receiver configured to removably holding a first carrier having a first entrance opening allowing egress of a wafer therefrom; a second carrier receiver disposed at a position adjacent to the first carrier receiver and configured to removably hold a second carrier having a second entrance opening through which the wafer is transferred through the first entrance opening of the first carrier; moving means for moving the first carrier receiver to a first entrance position wherein the first carrier can be attached to the first carrier receiver in a state where the first entrance opening is oriented in the upper direction and to a first reception position wherein the wafer can be transferred between the first carrier and the second carrier, the moving means being configured to move the second carrier receiver to a second entrance position wherein the second carrier can be attached to the second carrier receiver in a state where the second entrance opening is oriented in the upper direction and to a second reception position wherein the first entrance opening of the first carrier moved to the first reception position is opposed to the second entrance opening of the second carrier; and wafer transferring means for transferring the wafer between the first carrier and the second carrier in a state where the first entrance opening of the first carrier of the first carrier receiver moved to the first reception position is opposed to the second entrance opening of the second carrier of the second carrier receiver moved to the second reception position.

In a detailed embodiment, the moving means may include a first rotating shaft member configured to rotate the first carrier receiver between the first entrance position and the first reception position; an intermediate rotating shaft member configured to rotatably connecting the first carrier receiver and the second carrier receiver with each other; a second rotating shaft member configured to rotate the second carrier receiver between the second entrance position and the second reception position; and a rotation support member configured to movably support the second rotating shaft member toward and away from the first carrier receiving member, and where the wafer transferring means is configured by a tilting table configured to cause the first carrier receiver and the second carrier receiver to be tilted in a state where the first entrance opening of the first carrier is opposed to the second entrance opening of the second carrier.

In another aspect, a wafer transfer method using a wafer transfer device which may include a first carrier receiver configured to removably hold a first carrier having a first entrance opening allowing egress of a wafer therefrom; a second carrier receiver disposed at a position adjacent to the first carrier receiver and configured to removably hold a second carrier having a second entrance opening through which the wafer is transferred through the first entrance opening of the first carrier; moving means for moving the first carrier receiver to a first entrance position wherein the first carrier can be attached/removed to/from the first carrier receiver in a state where the first entrance opening is oriented in the upper direction and to a first reception position wherein the wafer can be transferred between the first carrier and the second carrier, the moving means being configured to move the second carrier receiver to a second entrance position wherein the second carrier can be attached/removed to/from the second carrier receiver in a state where the second entrance opening is oriented in the upper direction and to a second reception position wherein the first entrance opening of the first carrier moved to the first reception position is opposed to the second entrance opening of the second carrier; and wafer transferring means for transferring the wafer between the first carrier and the second carrier in a state where the first entrance opening of the first carrier of the first carrier receiver moved to the first reception position is opposed to the second entrance opening of the second carrier of the second carrier receiver moved to the second reception position, the wafer transfer method transferring the wafer between the first carrier and the second carrier, including the steps of: attaching the first carrier and the second carrier to the first carrier receiver and the second carrier receiver disposed at the first entrance position and the second entrance position, respectively; moving, by means of the moving means, the first carrier receiver from the first entrance position to the first reception position, while moving the second carrier receiver from the second entrance position to the second reception position; transferring, by means of the wafer transferring means, the wafer between the first carrier and the second carrier in a state where the first entrance opening of the first carrier of the first carrier receiver moved to the first reception position is opposed to the second entrance opening of the second carrier of the second carrier receiver moved to the second reception position; upon completion of the transferring of the wafer, moving, by means of the moving means, the first carrier receiver from the first reception position to the first entrance position, while moving the second carrier receiver from the second reception position to the second entrance position; and removing the first carrier and the second carrier from the first carrier receiver and the second carrier receiver disposed at the first entrance position and the second entrance position, respectively.

In another aspect, a wafer transfer method using a wafer transfer device which may include attaching a first semiconductor wafer carrier receiver to a second semiconductor wafer carrier receiver, where the first semiconductor wafer carrier receiver includes a first semiconductor wafer carrier and where the second semiconductor wafer carrier receiver includes a second semiconductor wafer carrier, where the first semiconductor wafer carrier receiver includes an opening through which a semiconductor wafer may egress and the second semiconductor wafer carrier includes and opening through which the semiconductor wafer may ingress; repositioning the first semiconductor wafer carrier receiver from a holding position to a conveying position, while moving the second carrier receiver from a default position to a reception position; transferring the semiconductor wafer from the first semiconductor wafer carrier and to the second semiconductor wafer carrier in its holding position where the opening of the first semiconductor wafer carrier of the first semiconductor wafer carrier receiver faces the opening of the second semiconductor wafer carrier of the second semiconductor wafer carrier receiver in its reception position; upon completion of the transferring of the semiconductor wafer, moving, the first carrier receiver from the first reception position to the first entrance position, while moving the second carrier receiver from the second reception position to the second entrance position; and removing the first semiconductor wafer carrier and the second semiconductor wafer carrier from the first carrier receiver and the second carrier receiver disposed at the first entrance position and the second entrance position, respectively.

In a detailed embodiment, during the step of repositioning the first semiconductor wafer carrier receiver from a holding position to a conveying position, while moving the second carrier receiver from a default position to a reception position, the first semiconductor wafer carrier and the second semiconductor wafer carrier may be simultaneously rotated toward one another along a common axis of rotation.

In another detailed embodiment, the transferring step may include a step of repositioning the first semiconductor wafer carrier and the second semiconductor wafer carrier when they are in their respective converging and receiving positions such that the first semiconductor wafer carrier opening faces at least partially downward towards the second semiconductor wafer carrier opening.

In another aspect, a wafer transfer method using a wafer transfer device may include rotating a first semiconductor wafer carrier in a clockwise direction with respect to a second semiconductor wafer carrier rotated in a counterclockwise direction so that an orifice of the first semiconductor wafer carrier through which a semiconductor wafer may egress is aligned with an orifice of the second semiconductor wafer carrier, where the first semiconductor wafer carrier includes a semiconductor wafer seated therein, where the rotation of the first semiconductor wafer carrier with respect to the second semiconductor wafer carrier creates an elevational gradient between the first semiconductor wafer carrier and a second semiconductor wafer carrier; and while having the elevational gradient, repositioning the wafer from the first semiconductor wafer carrier and through the orifice of the first semiconductor wafer carrier and through the orifice of the second semiconductor wafer carrier and into the second semiconductor wafer carrier.

DETAILED DESCRIPTION

Figure 1:
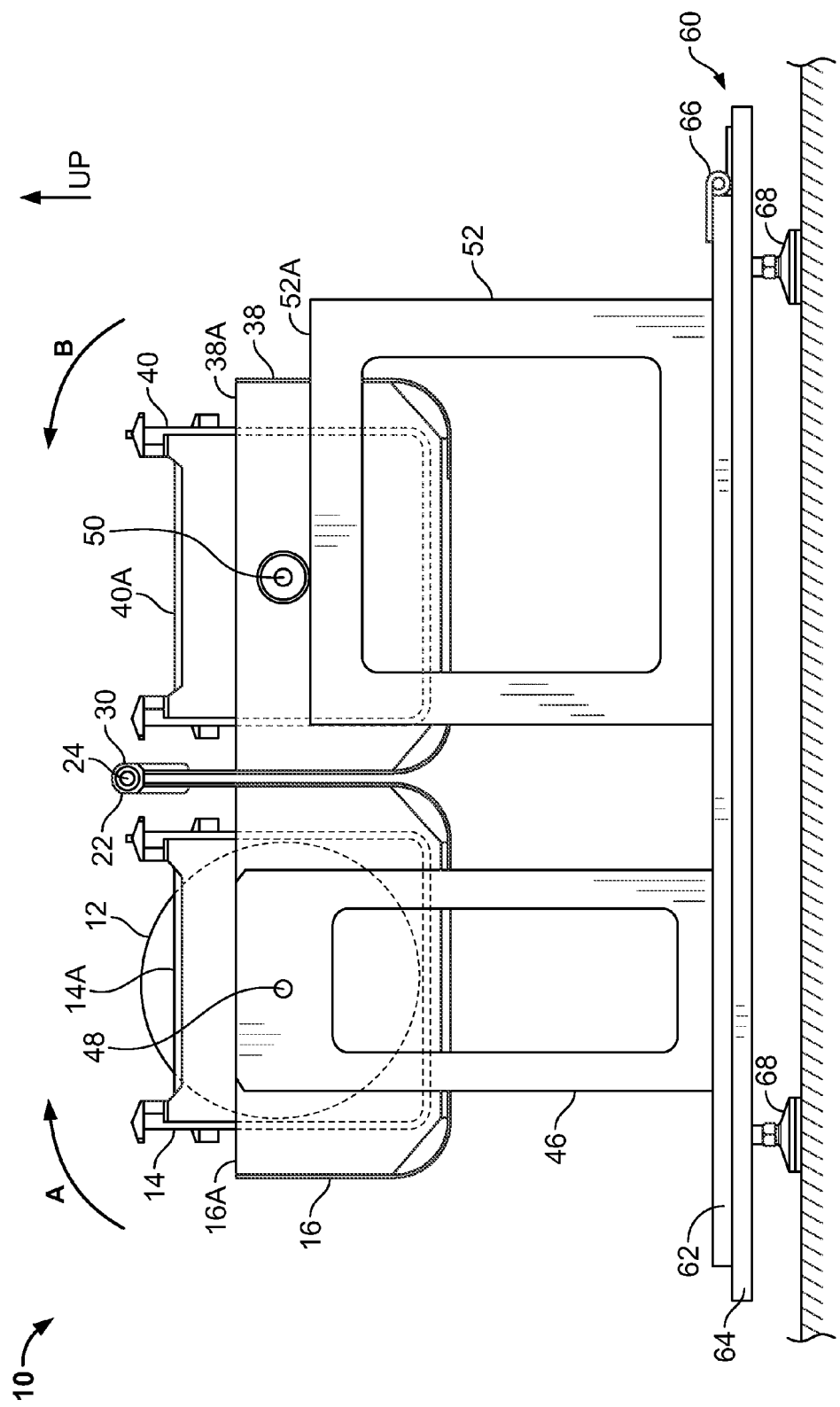
FIG. 1 is a profile view of a wafer transfer device according to a first exemplary embodiment.

The exemplary embodiments are described and illustrated below to encompass a wafer transfer device used for transferring one or more wafers received in a carrier to another carrier and a wafer transfer method using the same. Of course, it will be apparent to those of ordinary skill in the art that the embodiments discussed below are exemplary in nature and may be reconfigured without departing from the scope and spirit of the present invention. However, for clarity and precision, the exemplary embodiments as discussed below may include optional steps, methods, and features that one of ordinary skill should recognize as not being a requisite to fall within the scope of the present invention. For example, in the accompanying figures, an "UP arrow" designates a direction opposite to the direction of gravity.

Referencing FIGS. 1-12, an exemplary wafer transfer device 10 includes a first carrier receiver 16 that is installed so as to removably hold a first carrier 14 in which a plurality of circular semiconductor wafers 12 are received at a predetermined pitch. The first carrier 14 is formed of a resin material (in this exemplary embodiment, referred to as material A, which is the same type of resin material that is also applied to the wafer), and has a first entrance opening 14A allowing entry and egress of the wafers 12 thereto/therefrom. Moreover, a plurality of comb-like projections 18 (see FIG. 9) is formed to be opposed to each other on opposite inner walls of the first carrier 14 so that the wafers 12 can be received at the predetermined pitch.

Figure 10:
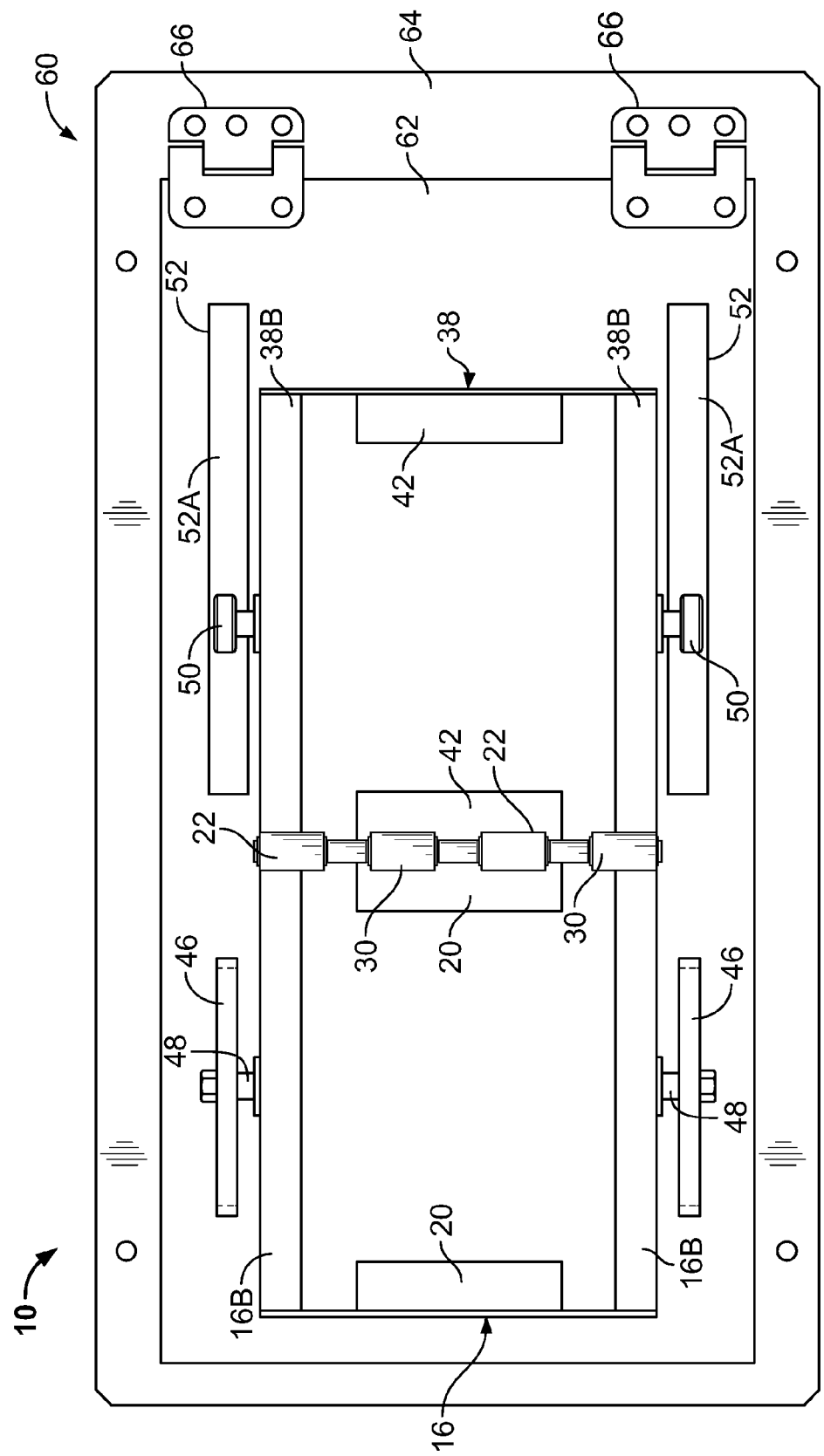
FIG. 10 is a top plan view of the wafer transfer device according to the first exemplary embodiment.
Figure 12:
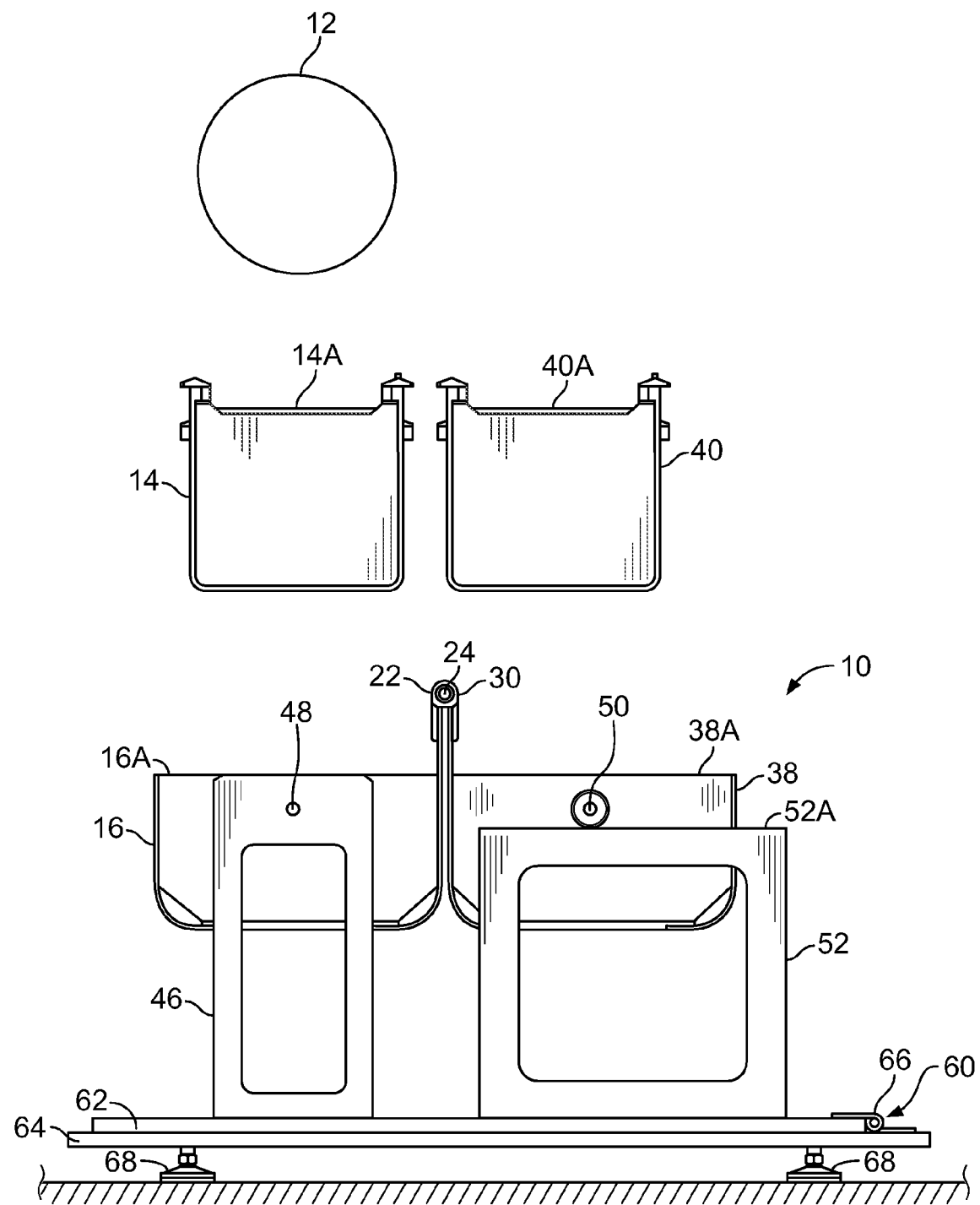
FIG. 12 is an exploded profile view of the wafer transfer device according to the first exemplary embodiment.

The first carrier receiver 16 has a box-like shape having an opening 16A through which the first carrier 14 is removably mounted to the first carrier receiver 16, and the opening 16A is oriented at the top of the first carrier receiver, facing in an upward direction at a first entrance position, which is illustrated in FIG. 12. Moreover, as illustrated in FIG. 10, two positioning guides 20 are installed to be opposed to each other in the first carrier receiver 16 so as to determine a one-directional position of the first carrier 14 received therein. Furthermore, the other directional position of the first carrier 14 is determined by side wall surfaces 16B (see FIG. 9) of the first carrier receiver 16. With such a configuration, the first carrier 14 can be removably mounted to the first carrier receiver 16 disposed at the first entrance position in a state where the first entrance opening 14A is oriented facing upward.

Figure 11A:
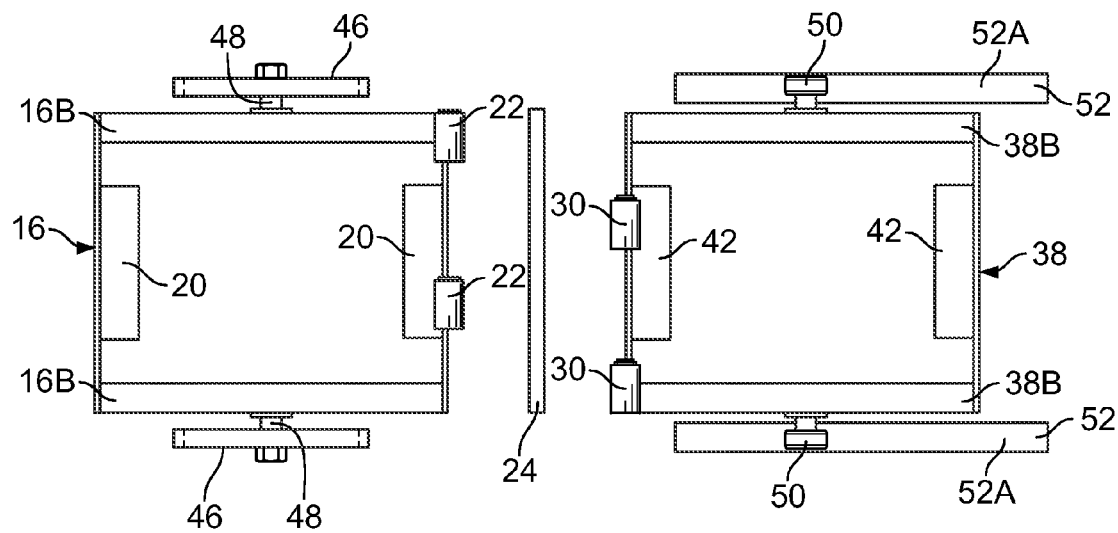
FIG. 11A is an exploded top plan view of a first carrier accommodator and a second carrier receiver employed in the wafer transfer device according to the first exemplary embodiment.
Figure 11B:
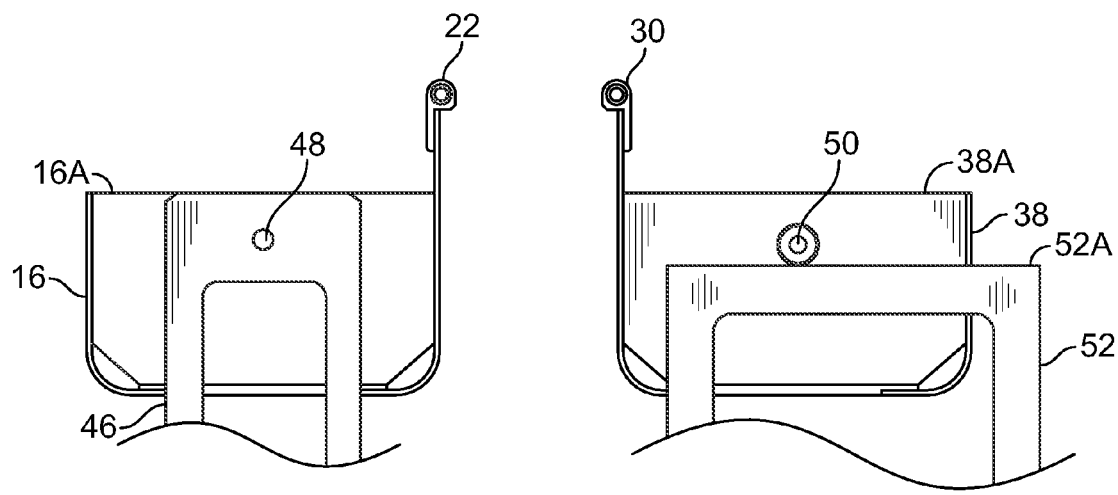
FIG. 11B is an exploded profile view of the first carrier accommodator and second carrier receiver of FIG. 11A.

Further, as illustrated in FIGS. 11A, 11B and 12, one end of the opening 16A of the first carrier receiver 16 extends in an upward direction, and a pair of bearing supports 22 (see FIG. 10) are provided at the upper end portion.

As illustrated in FIGS. 11A and 11B, a shaft 24 is provided so as to be inserted through the bearing supports 22, and the shaft 24 is configured to be alternately inserted through the bearing supports 22 and other bearing supports 30 provided to a later-described second carrier receiver 38.

Figure 7:
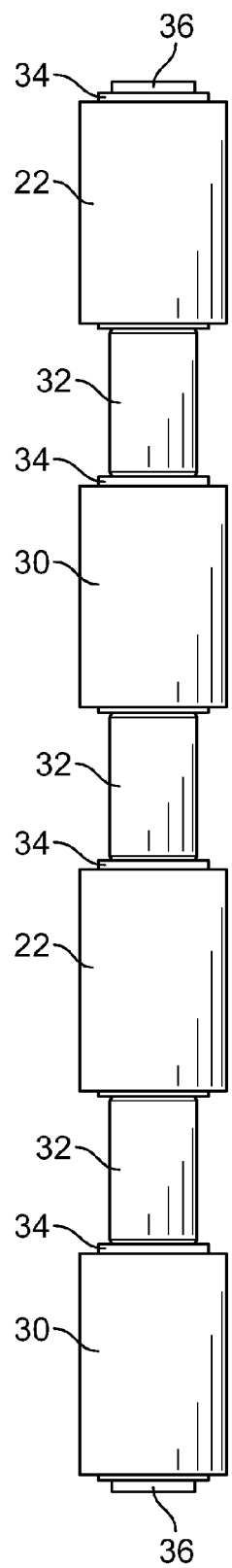
FIG. 7 is a top plan view of a bearing support and a spacer employed in the wafer transfer device according to the first exemplary embodiment.
Figure 8:
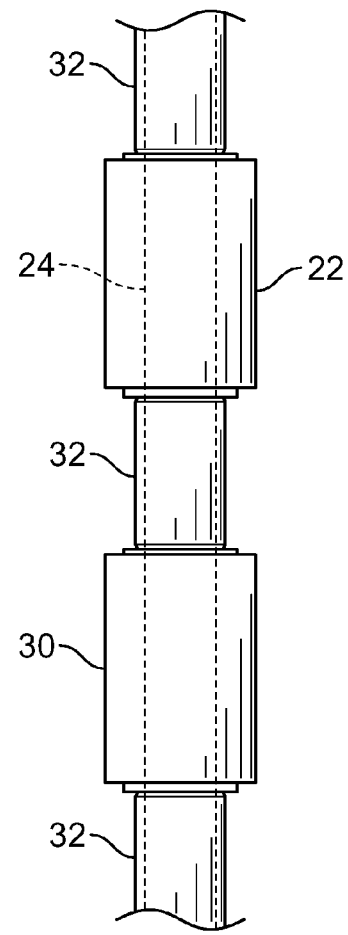
FIG. 8 is a segmented top plan view of the bearing support and the spacer of FIG. 7.
Figure 9:
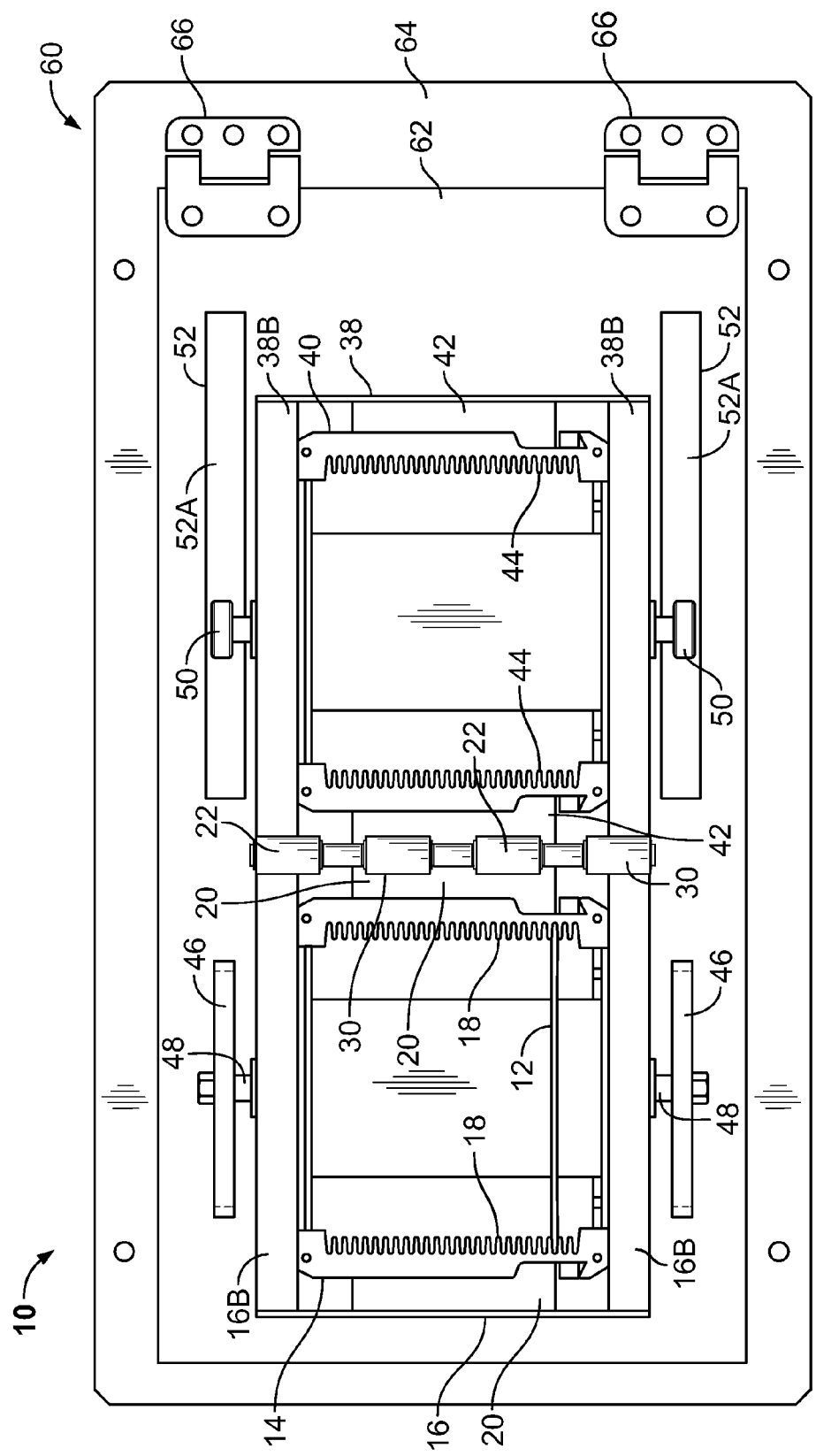
FIG. 9 is a top plan view of the wafer transfer device according to the first exemplary embodiment.

Specifically, as illustrated in FIGS. 7 and 8, three cylindrical spacers 32 are provided between the bearing supports 22, 30, which are alternately arranged, so that the bearing supports 22, 30 are held at a predetermined interval. Moreover, bearings 34 are installed between the bearing supports 22, 30 and the shaft 24.

Furthermore, screws 36 are threadably fixed at both sides of the shaft 24 so that the shaft 24 is prevented from coming off from the bearing supports 22, 30. Owing to such a configuration, the bearing supports 22, 30 are rotatable around the shaft 24.

As illustrated in FIG. 12, the bearing supports 30 are provided at an upper end portion extending in an upward direction from one end of a second carrier receiving receiver 38 having an opening 38A.

The second carrier receiver 38 is configured to removably hold a second carrier 40 capable of receiving therein the wafers 12, and the opening 38A is oriented in the upper direction at a second entrance position illustrated in FIG. 12. Moreover, as illustrated in FIG. 10, two positioning guides 42 are installed to be opposed to each other in the second carrier receiver 38 to guide the second carrier 40 received within the receiver 38. Furthermore, the position of the second carrier 40 is impacted by side wall surfaces 38B (see FIG. 9) of the second carrier receiver 38.

Moreover, as illustrated in FIG. 12, the second carrier 40 is received in the second carrier receiver 38 and has a box-like shape, similar to the first carrier 14, so that a plurality of circular semiconductor wafers 12 can be received at a predetermined pitch. The second carrier 40 is formed of a resin material (in this embodiment, referred to as a material B, which is the same resin material used for the first carrier 14), and has a second entrance opening 40A allowing entry and egress of the wafers 12. Moreover, a plurality of convex comb-like projections 44 (see FIG. 9) is formed to be opposed to each other on opposite inner walls of the second carrier 40 so that the wafers 12 can be received at the predetermined pitch.

With such a configuration, similar to the first carrier 14, the second carrier 40 can be removably mounted to the second carrier receiver 38 disposed at the second entrance position in a state where the second entrance opening 40A is oriented in the upward direction.

Meanwhile, as illustrated in FIG. 1, first rotating shafts 48, are connected to a motor (not shown) fixed to the first carrier receiver 16 and are rotatably supported by frames 46 having a rectangular shape extending in the vertical direction.

Specifically, as illustrated in FIG. 10, the frames 46 are provided to sandwich the first carrier receiver 16 therebetween, and the first rotating shafts 48 are rotatably supported by the respective frames 46 so that the first carrier receiver 16 is supported in a well-balanced manner.

Moreover, as illustrated in FIGS. 10 and 12, in the second carrier receiver 38, two second rotating shafts 50 having a circular outer diameter are provided in a state where the second carrier receiver 38 is disposed between them, so as to rotatably support the second carrier receiver 38. Moreover, the second rotating shafts 50 are disposed on upper surface portions 52A of frames 52 so as to extend in the vertical direction so that the second carrier receiver 38 is sandwiched therebetween. Specifically, the frames 52 are arranged along side wall surfaces 38B of the second carrier receiver 38, and the upper surface portions 52A are parallel surfaces. That is, the second rotating shafts 50 are configured to be able to roll and move on the upper surface portions 52A.

Figure 2:
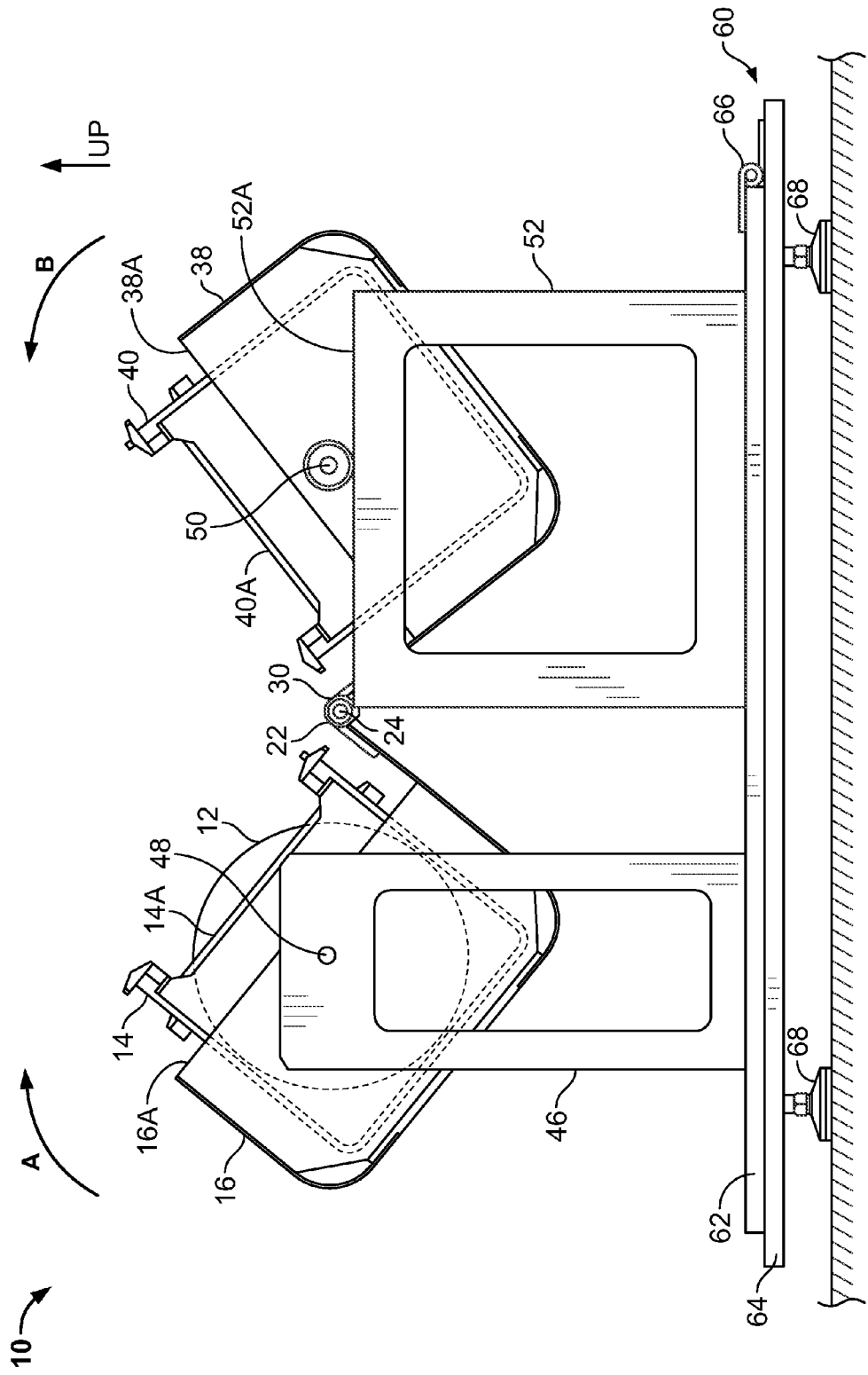
FIG. 2 is a profile view of the wafer transfer device according to the first exemplary embodiment.

Owing to such a configuration, as illustrated in FIG. 1, when an operation switch is pressed by an operator, a controller controlling the wafer transfer device 10 transmits a rotation force from a motor to the first rotating shafts 48 provided to the first carrier receiver 16 disposed at the first entrance position, so that the first carrier receiver 16 is rotated in the clockwise direction, represented pictorially by arrow "A." With this movement, the shaft 24 inserted through the bearing supports 22 of the first carrier receiver 16 is also rotated about the first rotating shafts 48 (see FIG. 2).

Furthermore, when the shaft 24 is rotated, the bearing supports 30 provided to the second carrier receiver 38 are rotated, so that the second carrier receiver 38 disposed at the second entrance position is rotated in a counterclockwise direction, represented pictorially as shown by arrow B about the second rotating shaft members 50 rotatably supporting the second carrier receiver 38 while moving on the upper surface portions 52A (see FIG. 2).

Figure 3:
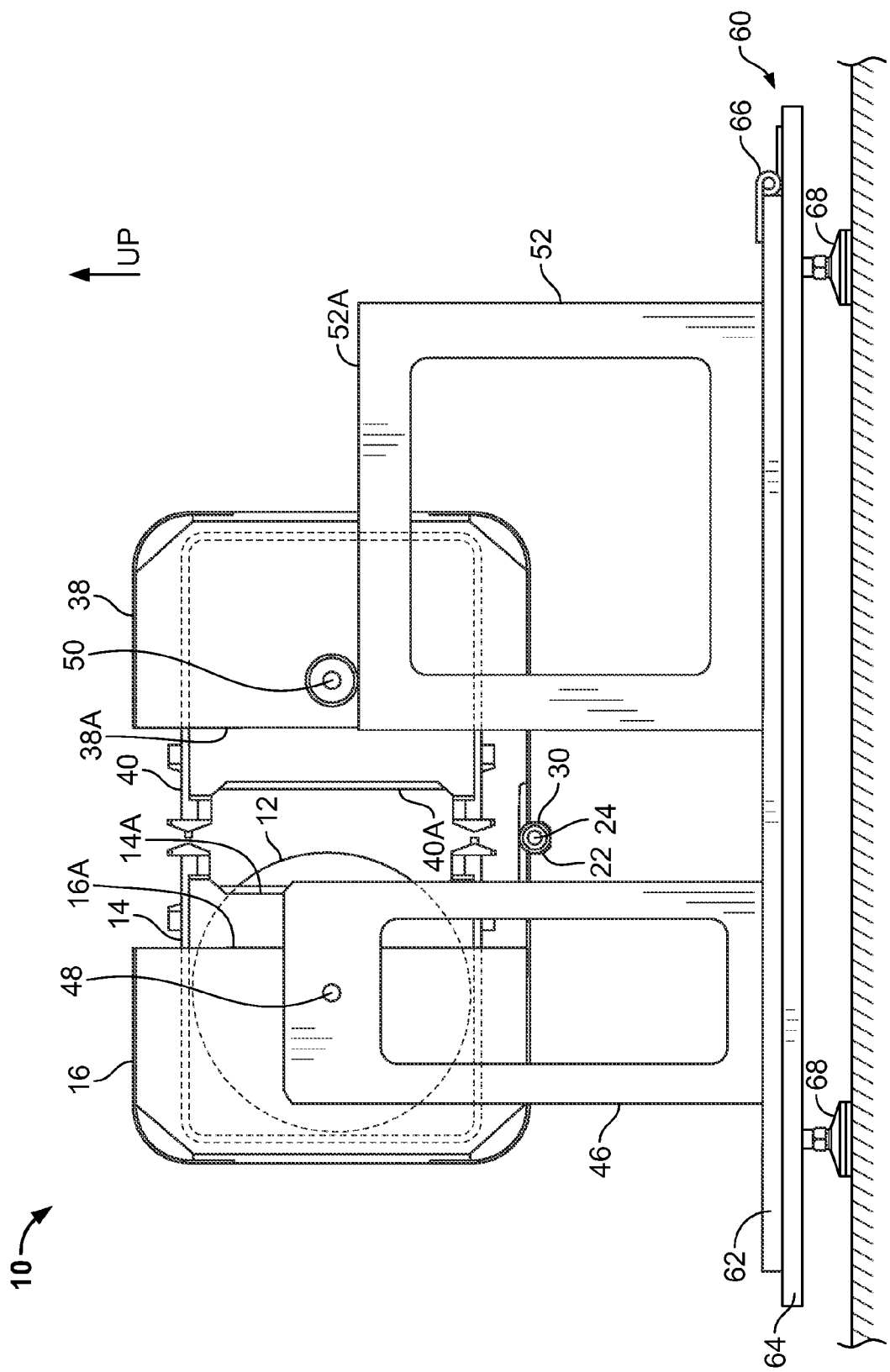
FIG. 3 is a profile view of the wafer transfer device according to the first exemplary embodiment.

As illustrated in FIGS. 2 and 3, the rotated first carrier receiver 16 and the rotated second carrier receiver 38 are further rotated to a first reception position and a second reception position (see FIG. 3), respectively, where the first entrance opening 14A of the first carrier 14 is opposed to, and aligned with, the second entrance opening 40A of the second carrier 40. That is, the first carrier receiver 16 is configured to be pivotable between the first entrance position (see FIG. 1) and the first reception position (see FIG. 3), while the second carrier receiver 38 is configured to be pivotable between the second entrance position (see FIG. 1) and the second reception position (see FIG. 3).

Moreover, sensors (not shown) capable of detecting whether or not the first carrier 14 and the second carrier 40 are received in the first carrier receiver 16 and the second carrier receiver 38, respectively, are installed. Therefore, when the first carrier 14 and the second carrier 40 are not received in the first carrier receiver 16 and the second carrier receiver 38, respectively, the first carrier receiver 16 and the second carrier receiver 38 are not rotated from the first entrance position and the second entrance position, respectively, in accordance with instructions of the controller (not shown).

Moreover, sensors capable of detecting whether or not the wafers 12 are received in the first carrier 14 and whether or not the wafers 12 are received in the second carrier 40 are installed. Therefore, when the wafers 12 are received in both of the first carrier 14 and the second carrier 40, the first carrier receiver 16 and the second carrier receiver 38 are not rotated from the first entrance position and the second entrance position, respectively, in accordance with instructions of the controller.

Figure 4:
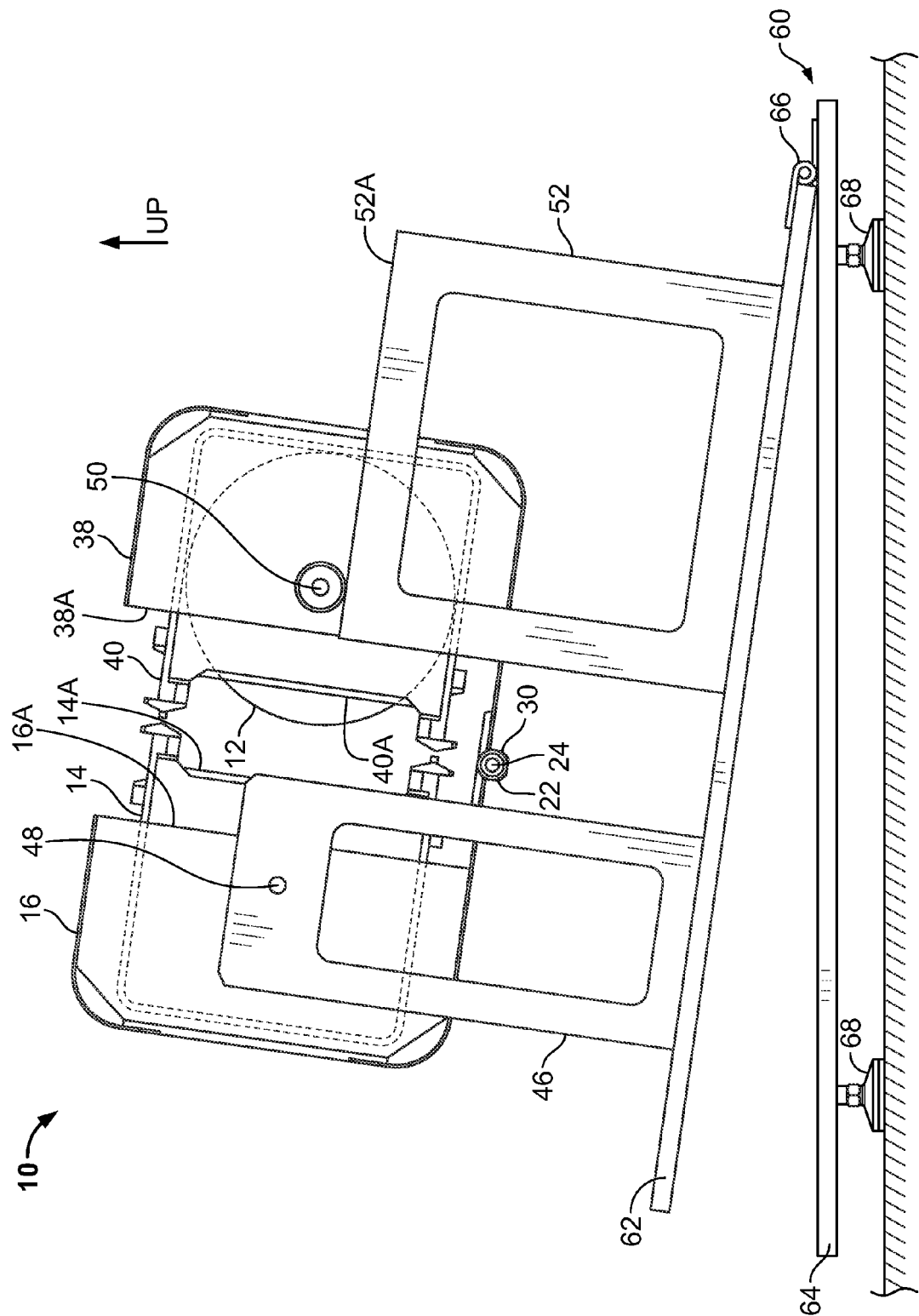
FIG. 4 is a profile view of the wafer transfer device according to the first exemplary embodiment.

Meanwhile, as illustrated in FIGS. 1 and 4, the frames 46 rotatably supporting the first rotating shaft 48 and the frames 52 supporting the second rotating shaft 50 are fixed to a tilting table 60 configured to tiltably support the frames 46, 52. Specifically, the tilting table 60 is configured to include a mounting plate 62 having the frame members 46, 52 fixed to an upper surface thereof, a base plate 64 configured to support the mounting plate 62 from below, a hinge member 66 configured to rotatably support the mounting plate 62 by being fixed to an upper surface of the base plate 64 and an end portion of the mounting plate 62, and a plurality of legs 68 configured to support the base plate 64.

With such a configuration, as illustrated in FIG. 4, the mounting plate 62 is tilted when a driving force of a driving device, such as a motor (not shown), is transmitted to the tilting table 60 by the controller (not shown) controlling the wafer transfer device 10 in accordance with instructions from an operator (not shown). Moreover, when the mounting plate 62 is tilted, the frames 46, 52 are also tilted.

Referring again to FIG. 12, a method for transferring the wafers 12 received in the first carrier 14 to the second carrier 40 using the wafer transfer device 10 includes an operator receiving the wafers 12 within the first carrier 14 through the first entrance opening 14A of the first carrier 14.

Next, as illustrated in FIGS. 1 and 12, the first carrier 14 formed of material A and the second carrier 40 formed of material B are respectively attached to the first carrier receiver 16 and the second carrier receiver 38 disposed at the first entrance position and the second entrance position.

As described above, since the first opening 16A of the first carrier receiver 16 is disposed at the first entrance position and the second opening 38A of the second carrier receiver 38 is disposed at the second entrance position, with both openings 16A, 38A being oriented in the upper direction, the first carrier 14 and the second carrier 40 can be attached to the first carrier receiver 16 and the second carrier receiver 38, respectively, without needing to tilt the first and second carriers 14, 40.

Next, as illustrated in FIG. 2, when the operation switch is pressed by the operator, the controller controlling the wafer transfer device 10 transmits a rotation force of a motor to the first rotating shafts 48, provided the first carrier receiver 16 is disposed at the first entrance position, so that the first carrier receiver 16 is rotated in the clockwise direction, illustrated by arrow A. Moreover, with the movement of the first carrier receiver 16, the shaft 24 is also rotated about the first rotating shafts 48 in the clockwise direction.

When the shaft 24 is rotated, the bearing supports 30 mounted to the second carrier receiver 38 are rotated about the second rotating shafts 50. When the bearing supports 30 are rotated, the second carrier receiver 38 disposed at the second entrance position is rotated counterclockwise in the direction as shown by arrow "B" about the second rotating shafts 50 rotatably supporting the second carrier receiver 38 while moving on the upper surface portions 52A.

When the first carrier receiver 16 is rotated in the clockwise direction shown by arrow A and the second carrier receiver 38 is rotated in the counterclockwise direction shown by arrow B (compare FIGS. 1-3), the first carrier receiver 16 and the second carrier receiver 38 stop at the first reception position and the second reception position, respectively, where the first entrance opening 14A of the first carrier 14 is opposed to, and aligned with, the second entrance opening 40A of the second carrier 40.

When the first carrier receiver 16 and the second carrier receiver 38 have stopped at the first reception position and the second reception position, respectively, as illustrated in FIG. 4, the controller causes the mounting plate 62 of the tilting table 60 to be tilted by the driving force of the driving device from its initial position. When the mounting plate 62 is tilted from the initial position where the mounting plate 62 overlaps with the base plate 64, the first carrier receiver 16 is disposed at an elevated position with respect to the second carrier receiver 38. Since the first carrier receiver 16 is disposed at an elevated position with respect to the second carrier receiver 38, the wafers 12 received in the first carrier 14 roll out from the first carrier through the first entrance opening 14A and toward the second carrier 40 to be transferred to the second carrier 40 through the second entrance opening 40A.

Figure 5:
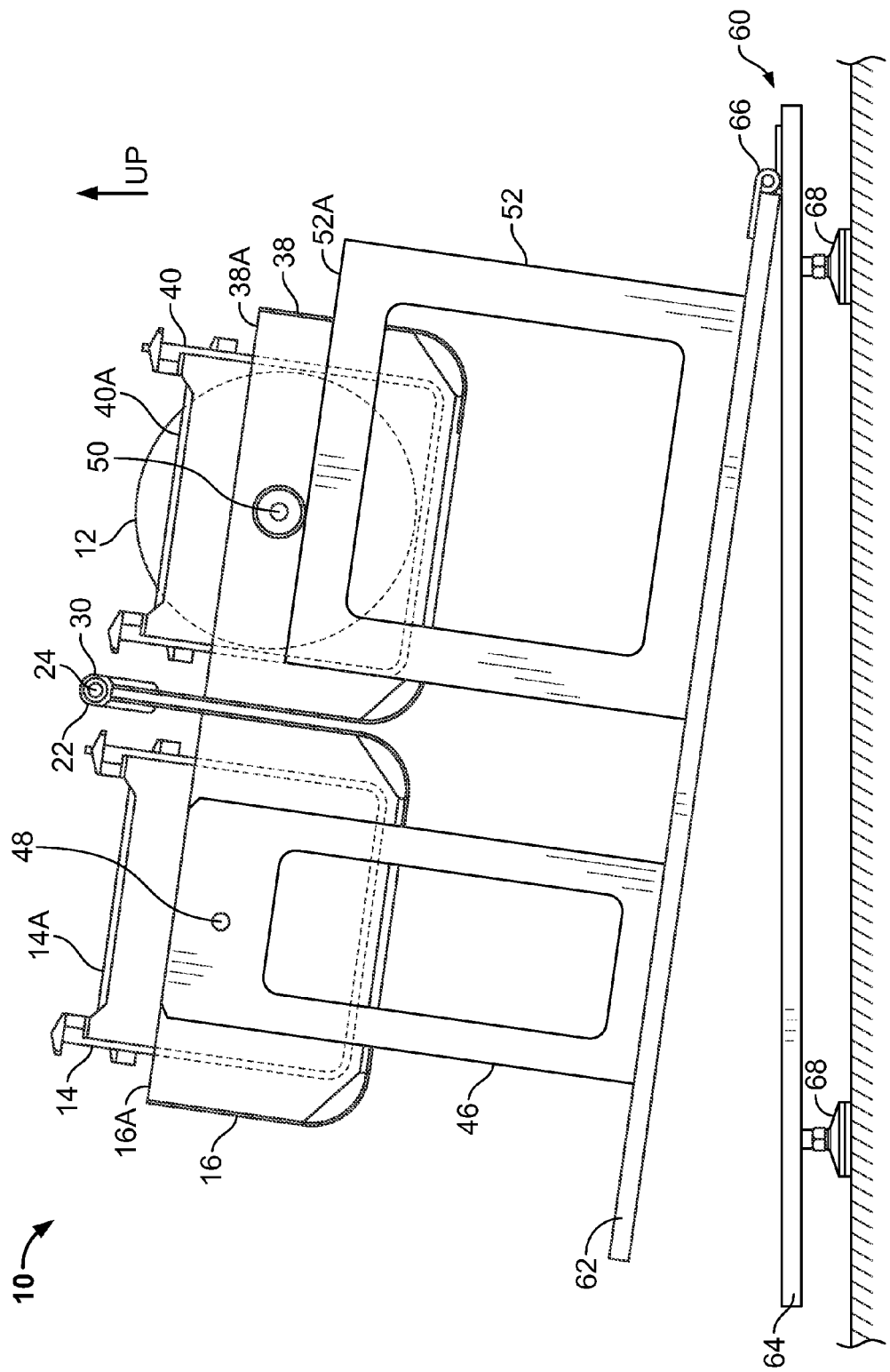
FIG. 5 is a profile view of the wafer transfer device according to the first exemplary embodiment.
Figure 6:
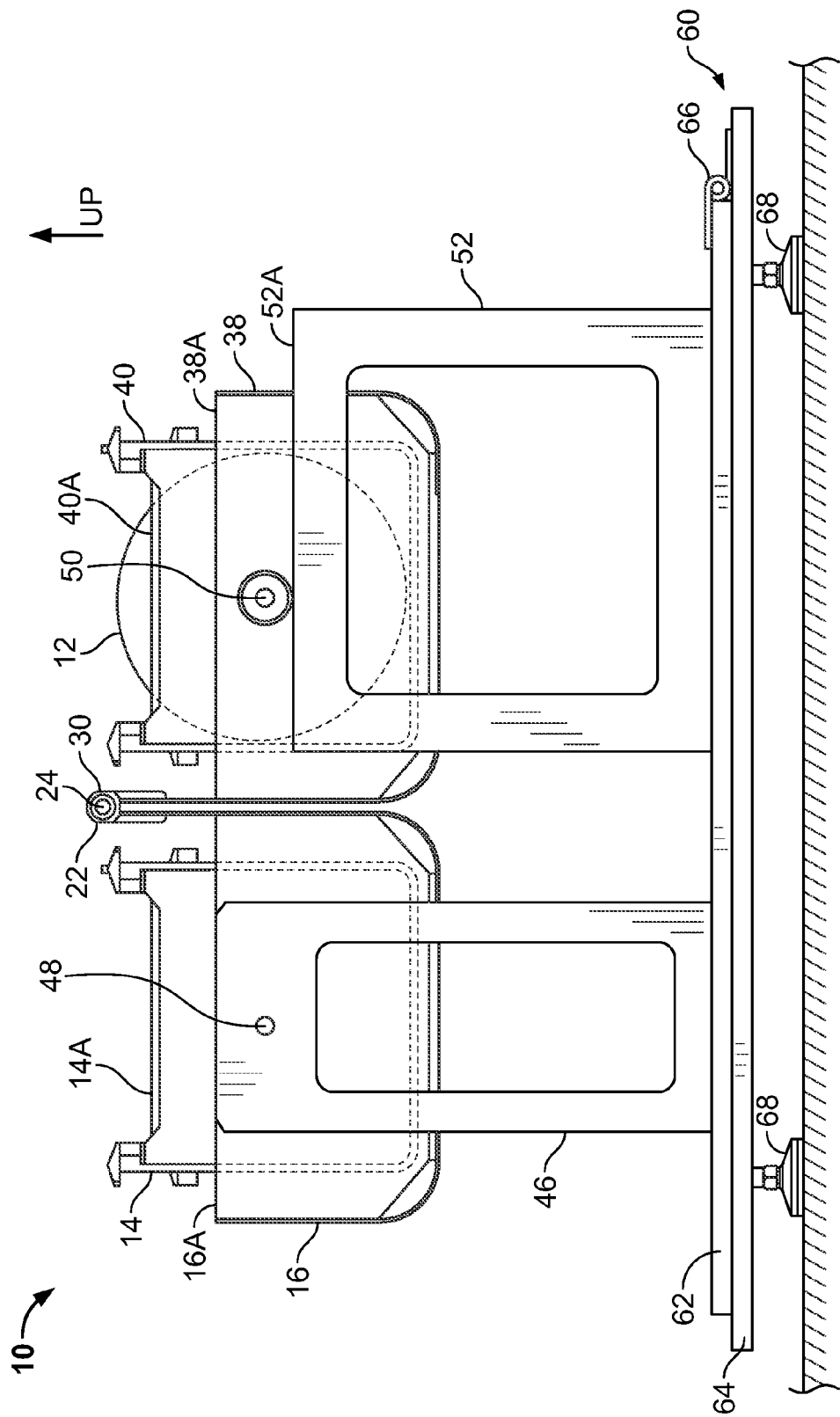
FIG. 6 is a profile view of the wafer transfer device according to the first exemplary embodiment.

Next, as illustrated in FIGS. 5 and 6, when the controller controlling the wafer transfer device 10 rotates the first rotating shafts 48 by the rotation force of the motor so that the tilted mounting plate 62 returns to its initial position, the first carrier receiver 16 disposed at the first reception position is moved to the first entrance position while the second carrier receiver 38 disposed at the second reception position is moved to the second entrance position. The opening 16A of the first carrier receiver 16 disposed at the first entrance position is oriented in the upper direction, and the first entrance opening 14A of the first carrier 14 received in the first carrier receiver 16 is oriented in the upper direction. Similarly, the opening 38A of the second carrier receiver 38 disposed at the second entrance position is oriented in the upper direction, and the entrance opening 40A of the second carrier 40 received in the second carrier receiver 38 is oriented in the upper direction.

Thereafter, the first carrier 14 is removed from the first carrier receiver 16 in a state where the first entrance opening 14A is oriented in the upper direction, while the second carrier 40 is removed from the second carrier receiver 38 in a state where the second entrance opening 40A is oriented in the upper direction, whereby an operation of transferring the wafer 12 from the first carrier 14 to the second carrier 40 is completed. In this way, the first carrier 14 and the second carrier 40 can be removably mounted to the first carrier receiver 16 and the second carrier receiver 38, respectively, in a state where the first entrance opening 14A of the first carrier 14 and the second entrance opening 40A of the second carrier 40 are oriented in the upper direction. For this reason, it is possible to prevent the wafers 12 received in the first carrier 14 and the second carrier 40 from falling off from the first carrier 14 and the second carrier 40, respectively. Moreover, by tilting the tilting table 60 to cause the wafers 12 to roll, the wafers 12 can be transferred from the first carrier 14 to the second carrier 40, which are formed of different materials.

Furthermore, in a state where the first carrier 14 and the second carrier 40 are not received in the first carrier receiver 16 and the second carrier receiver 38, respectively, the first carrier receiver 16 and the second carrier receiver 38 are not operated. Therefore, it is possible to prevent any unnecessary operation. Furthermore, since the first carrier receiver 16 and the second carrier receiver 38 are not operated in a state where the wafers 12 are received in both the first carrier 14 and the second carrier 40, it is possible to prevent any unnecessary operation.

In addition, since the first carrier 14 and the second carrier 40 can be removably mounted to the first carrier receiver 16 and the second carrier receiver 38, respectively, in a state where the first entrance opening 14A of the first carrier 14 and the second entrance opening 40A of the second carrier 40 are oriented in the upper direction, the attachment/removal of the first carrier 14 and the second carrier 40 can be carried out automatically by a robot or the like.

It is, therefore, to be understood that a variety of different embodiments will occur to those skilled in the art without departing from the true spirit and scope of the disclosure. For example, in the above-described exemplary embodiment, a rotation force is transmitted to the first rotating shafts 48 fixed to the first carrier receiver 16, and the force is transmitted to the second carrier receiver 38 via the shaft 24, thereby rotating the second carrier receiver 38. However, the second carrier receiver 38 may be rotated by providing a motor or the like for rotating solely the second carrier receiver 38.

Moreover, in the above-described exemplary embodiment, a rotation force is applied to the first rotating shafts 48 in a state (see FIG. 4) where the first carrier receiver 16 is disposed at the first reception position and the second carrier receiver 38 is disposed at the second reception position, so that the first carrier receiver 16 and the second carrier receiver 38 are oriented approximately in an inclined or elevated position, and thereafter, the mounting plate 62 is rotated to return the receivers 16, 38 to their initial position. However, these operations may be performed at the same time or, alternatively, the rotation force may be applied to the first rotating shafts 48 after the mounting plate 62 has returned to its initial position.

Figure 13:
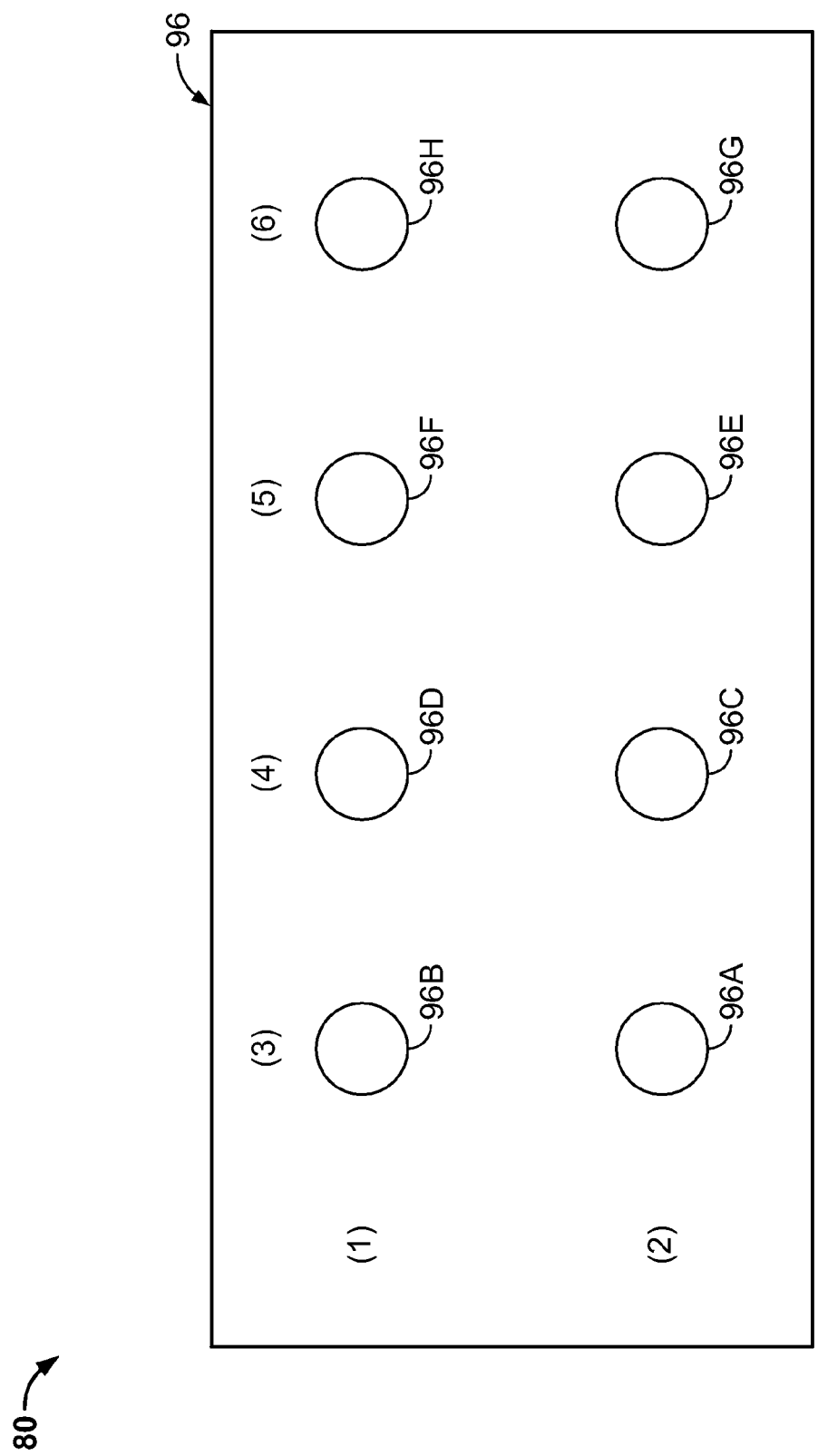
FIG. 13 is a frontal view of an alarm panel employed in a wafer transfer device according to a second exemplary embodiment.
Figure 14:
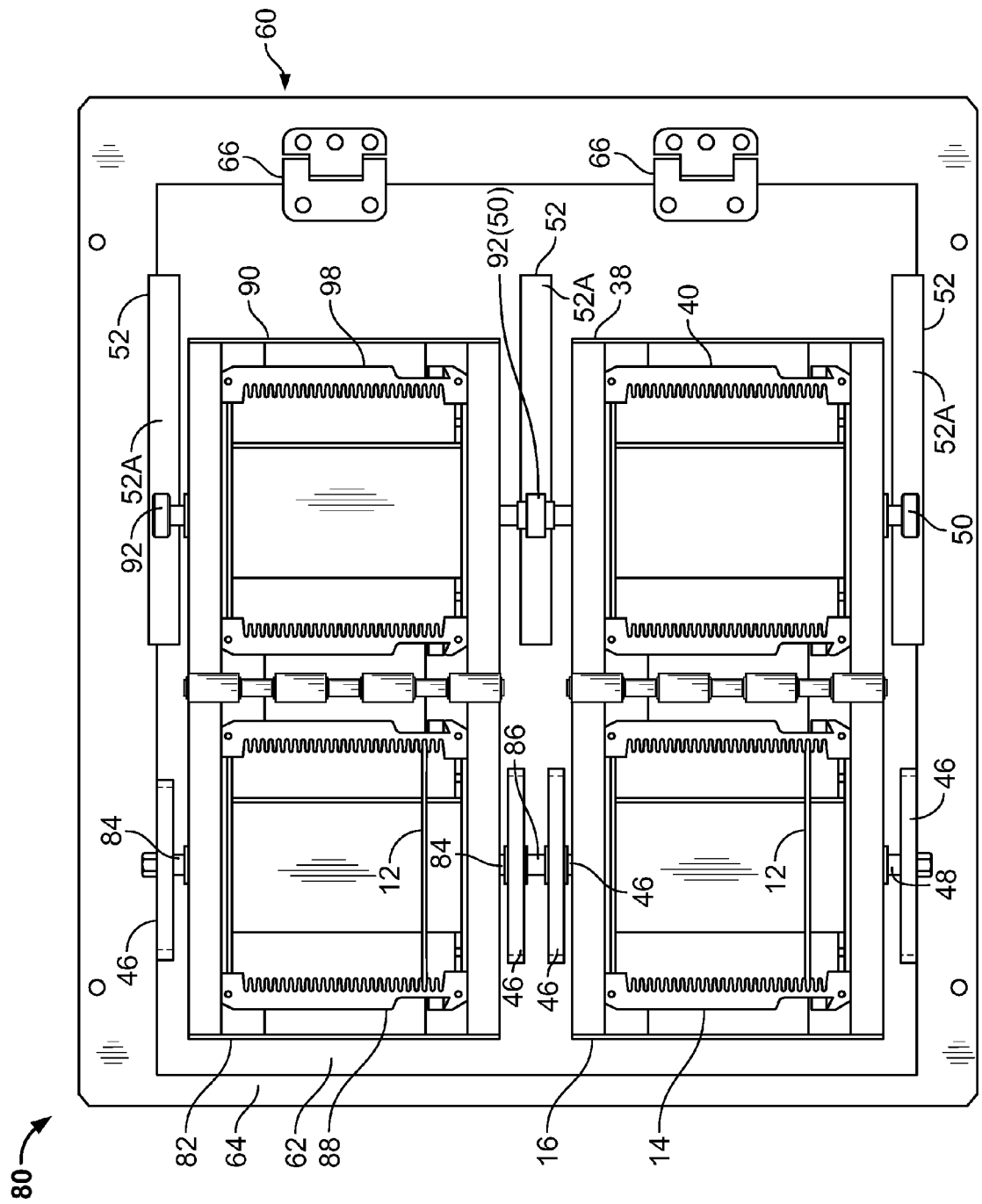
FIG. 14 is a top plan view of the wafer transfer device according to the second exemplary embodiment.

Referring to FIGS. 13 and 14, a second exemplary wafer transfer device 80 includes the some of the same components as the first exemplary embodiment, which will be denoted by the same reference numerals. This second exemplary embodiment, however, differs from the first exemplary embodiment in that four carriers (instead of two carriers) are removably attached to the wafer transfer device 80. Specifically, a third carrier receiver 82 is configured to receive therein a third carrier 88, having a shape the same as the first carrier receiver 16, that is installed at a position adjacent to the first carrier receiver 16. Similarly, third rotating shafts 84 of the third carrier receiver 82 are connected to the first rotating shafts 48 via a shaft 86. With such a configuration, the third carrier receiver 82 can be rotated simultaneously with the first carrier receiver 16.

Similarly, a fourth carrier receiver 90 is configured to receive therein a fourth carrier 98, having a shape the same as the second carrier receiver 38, that is installed at a position adjacent to the second carrier receiver 38. Moreover, fourth rotating shaft members 92 of the fourth carrier receiver 90 are provided between the second carrier receiver 38 and the fourth carrier receiver 90 and shared with the second rotating shaft members 50 of the second carrier receiver 38. With such a configuration, the fourth carrier receiver 90 can be rotated simultaneously with the second carrier receiver 38.

Moreover, as illustrated in FIG. 13, an alarm panel 96 for informing an attachment state of the carriers and a reception state of the wafer is provided as part of the wafer transfer device 80. Specifically, when the first carrier 14 is mounted on the first carrier receiver 16, a lamp 96A is lighted, while a lamp 96B is lighted when the wafer 12 is received in the first carrier 14 mounted on the first carrier receiver 16. Similarly, when the second carrier 40 is mounted on the second carrier receiver 38, a lamp 96C is lighted, while a lamp 96E is lighted when the third carrier 88 is mounted on the third carrier receiver 82, and a lamp 96G is lighted when the fourth carrier 98 is mounted on the fourth carrier receiver 90. Moreover, when the wafer 12 is received in the second carrier 40, a lamp 96D is lighted, while a lamp 96F is lighted when the wafer 12 is received in the third carrier 88, and a lamp 96H is lighted when the wafer 12 is received in the fourth carrier 98. In this manner, an operator can be informed of the attachment state of the first carrier 14, the second carrier 40, the third carrier 88, and the fourth carrier 98 and the reception state of the wafers 12 in the respective carriers by looking at the alarm panel 96. For this reason, it is possible to decrease operational errors of the operator and the like. Moreover, since the first carrier receiver 16 and the third carrier receiver 82 are configured to be simultaneously rotated and the second carrier receiver 38 and the fourth carrier receiver 90 are configured to be simultaneously rotated, the wafers 12 can be transferred from the first carrier 14 to the second carrier 40 and from the third carrier 88 to the fourth carrier 98 by a series of operations.

Following from the above description, it should be apparent to those of ordinary skill in the art that, while the methods and apparatuses herein described constitute exemplary embodiments of the present disclosure, the invention is not limited to these precise embodiments and that changes may be made to such embodiments without departing from the scope of the invention as defined by the claims. Additionally, it is to be understood that the invention is defined by the claims and it is not intended that any limitations or elements describing the exemplary embodiments set forth herein are to be incorporated into the interpretation of any claim element unless such limitation or element is explicitly stated. Likewise, it is to be understood that it is not necessary to meet any or all of the identified advantages or objects of the invention disclosed herein in order to fall within the scope of any claims, since the invention is defined by the claims and since inherent and/or unforeseen advantages of the present invention may exist even though they may not have been explicitly discussed herein.

What is claimed is:

1. A wafer transfer device comprising:
a first rotatable semiconductor wafer carrier receiver removably mounted to a first wafer carrier having an opening allowing entry of a wafer into the first wafer carrier and allowing egress of the wafer from the first wafer carrier;
a second rotatable semiconductor wafer carrier receiver disposed at a position adjacent to the first semiconductor wafer carrier receiver and removably mounted to a second semiconductor wafer carrier having an opening through which the wafer is transferred through the opening of the first semiconductor wafer carrier;
an actuator operatively coupled to at least one of the first semiconductor wafer carrier receiver and the second semiconductor wafer carrier receiver, the actuator operative to concurrently rotate the first semiconductor wafer carrier receiver and the second semiconductor wafer carrier receiver so that both openings of the first and second semiconductor wafer carriers are rotated and face one another;
a moving mechanism coupled to the actuator, the moving mechanism comprising:
a first rotating shaft configured to rotate the first semiconductor wafer carrier receiver between a first wafer entrance position and a first wafer reception position;
an intermediate rotating shaft configured to rotatably connect the first semiconductor wafer carrier receiver and the second semiconductor wafer carrier receiver with each other; and
a second rotating shaft configured to rotate the second semiconductor wafer carrier receiver between a second wafer entrance position and a second wafer reception position.

2. The wafer transfer device according to claim 1, farther comprising a tilting table operative to at least one of the first semiconductor wafer carrier receiver and the second semiconductor wafer carrier receiver in a state where the opening of the first semiconductor wafer carrier is opposed to the opening of the second semiconductor wafer carrier.

3. The wafer transfer device according to claim 1, further comprising:
a first stationary frame mounted to the first semiconductor wafer carrier receiver and about which the first semiconductor wafer carrier receiver rotates; and
a second stationary frame mounted to the second semiconductor wafer carrier receiver and about which the second semiconductor water carrier receiver rotates.

4. The wafer transfer device according to claim 3, wherein the second semiconductor wafer carrier receiver is laterally and rotationally repositionable with respect to the second stationary frame.

5. A wafer transfer device comprising:
a first rotatable semiconductor wafer carrier receiver removably mounted to a first wafer carrier having an opening allowing entry of a wafer into the first wafer carrier and allowing egress of the wafer from the first wafer carrier;
a second rotatable semiconductor wafer carrier receiver disposed at a position adjacent to the first semiconductor wafer carrier receiver and removably mounted to a second semiconductor wafer carrier having an opening through which the wafer is transferred through the opening of the first semiconductor wafer carrier;
an actuator operatively coupled to at least one of the first semiconductor wafer carrier receiver and the second semiconductor wafer carrier receiver, the actuator operative to concurrently rotate the first semiconductor wafer carrier receiver and the second semiconductor wafer carrier receiver so that both openings of the first and second semiconductor wafer carriers are rotated and face one another;
a first stationary frame mounted to the first semiconductor carrier receiver and about which the first semiconductor wafer carrier receiver rotates; and
a second stationary frame mounted to the second semiconductor wafer carrier receiver and about which the second semiconductor wafer carrier receiver rotates;
an axle selectively engaging at least one of the first semiconductor wafer carrier receiver and the second semiconductor wafer carrier receiver, wherein:
the first semiconductor wafer carrier receiver includes a first bearing;
the second semiconductor wafer carrier receiver includes a second bearing;
the first bearing and second bearing are adapted to receive the axle and be coaxial with respect to one another so that the first semiconductor wafer carrier receiver and the second semiconductor wafer carrier receiver are rotatable about the axle.

6. A wafer transfer device comprising:
a first carrier receiver configured to removably holding a first carrier having a first entrance opening allowing egress of a wafer therefrom;
a second carrier receiver disposed at a position adjacent to the first carrier receiver and configured to removably hold a second carrier having a second entrance opening through which the wafer is transferred through the first entrance opening of the first carrier;
moving means for moving the first carrier receiver to a first entrance position wherein the first carrier can be attached to the first carrier receiver in a state where the first entrance opening is oriented in the upper direction and to a first reception position wherein the wafer can be transferred between the first carrier and the second carrier, the moving means being configured to move the second carrier receiver to a second entrance position wherein the second carrier can be attached to the second carrier receiver in a state where the second entrance opening is oriented in the upper direction and to a second reception position wherein the first entrance opening of the first carrier moved to the first reception position is opposed to the second entrance opening of the second carrier; and
wafer transferring means for transferring the wafer between the first carrier and second carrier in a state where first entrance opening of the first carrier of the first carrier receiver moved to the first reception position is opposed to the second entrance opening of the second carrier of the second carrier receiver moved to the second reception position; wherein the moving means comprises:
a first rotating shaft member configured to rotate the first carrier receiver between the first entrance position and the first reception position;
an intermediate rotating shaft member configured rotatably connecting first carrier receiver and the second carrier receiver with each other;
a second rotating shaft member configured to rotate the second carrier receiver between the second entrance position and the second reception position; and
a rotation support member configured to movably support the second rotating shaft member toward and away from the first carrier receiving member, and
wherein the wafer transferring means is configured by a tilting table configured to cause the first carrier receiver and the second carrier receiver to be tilted in a state where the first entrance opening of the first carrier is opposed to the second entrance opening of the second carrier.

7. A wafer transfer device comprising:
a first carrier receiver configured to removably hold a first carrier having a first entrance opening allowing egress of a wafer therefrom;
a second carrier receiver disposed at position adjacent to the first carrier receiver and configured to removably hold a second carrier having a second entrance opening through which the wafer is transferred through the first entrance opening of the first carrier;
a motor operatively coupled to the first carrier receiver and operative to reposition the first carrier receiver to a first entrance position wherein the first carrier can be attached to the first carrier receiver in a state where the first entrance opening is oriented in the upper direction and to a first reception position wherein the wafer can be transferred between the first carrier and the second carrier, the motor also operatively coupled to the second carrier receiver to reposition the second carrier receiver to a second entrance position, wherein the second carrier can be attached to the second carrier receiver in a state where the second entrance opening is oriented in the upper direction and to second reception position wherein the first entrance opening of the first carrier moved to the first reception position is opposed the second entrance opening of the second carrier; and,
a tilt plate for transferring the wafer between the first carrier and the second carrier in a state where the first entrance of the first carrier of the first carrier receiver moved to the first reception position is opposed to the second entrance opening of the second carrier of the second carrier receiver moved to the second reception position; wherein the motor is also operatively coupled to:
a first rotating shaft member configured to rotate the first carrier receiver between the first entrance position and the first reception position;
an intermediate rotating shaft member configured to rotatably connecting the first carrier receiver and the second earner receiver with each other;
a second rotating shaft member configured to rotate the second carrier receiver between the second entrance position and the second reception position; and,
a rotation support member configured to movably support the second rotating shaft member toward and away from the first carrier receiving member.

8. A wafer transfer device comprising:

a first semiconductor wafer carrier receiver configured to at least partially enclose a semiconductor wafer, the first semiconductor wafer carrier receiver including an opening allowing egress of the semiconductor wafer;

a second semiconductor wafer carrier receiver configured to at least partially enclose second wafer, the second semiconductor wafer carrier receiver including an opening allowing ingress of the semiconductor wafer; and, an actuator operatively coupled to at least one of the first semiconductor wafer carrier receiver and the second semiconductor wafer carrier receiver, the actuator configured to reposition at least one of the first semiconductor wafer carrier receiver and the second semiconductor wafer carrier receiver so that both openings of the first and second semiconductor wafer carrier receivers face one another;

wherein the first water earner receiver and the second wafer carrier receiver are configured include a common rotational axis; and, wherein the first wafer carrier receiver and the second wafer carrier receiver are configured to be mounted to one another and rotate with respect to one another along the common rotational axis.

* * * * *